United States Patent [19]

Nador

[11] 4,142,149
[45] Feb. 27, 1979

[54] CONTROL METER USABLE AS A POTENTIOMETRIC OR PHOTOELECTRIC DEVICE

[75] Inventor: Julius Nador, Plainfield, N.J.

[73] Assignee: Sangamo Weston, Inc., Newark, N.J.

[21] Appl. No.: 796,272

[22] Filed: May 12, 1977

[51] Int. Cl.² .......................... G01R 1/02; G01R 5/00
[52] U.S. Cl. ........................................ 324/157; 324/96
[58] Field of Search ............ 324/96, 157; 250/231 R, 250/233; 116/129 R, 136.5

[56] References Cited

U.S. PATENT DOCUMENTS

| 3,332,014 | 7/1967 | Orths et al. ........................ 324/157 |
| 3,355,593 | 11/1967 | Gately et al. ...................... 324/96 X |
| 3,435,341 | 3/1969 | Baron et al. ....................... 324/96 X |
| 3,588,516 | 6/1971 | Friedman ......................... 324/157 X |
| 3,596,178 | 7/1971 | Sklyaruk ............................. 324/96 |
| 3,788,795 | 1/1974 | Zeitlin ......................... 250/231 R X |
| 3,831,090 | 8/1974 | Woolner ............................ 324/157 |

Primary Examiner—Gerard R. Strecker
Attorney, Agent, or Firm—W. R. Sherman; K. McMahon; T. Langer

[57] ABSTRACT

A control meter is disclosed having a structural arrangement readily adaptable for usage as either a potentiometric or photoelectric type of instrument. Commonality of parts for the two types is maximized and only a few additions are required to operably complete the structure of either type.

39 Claims, 9 Drawing Figures

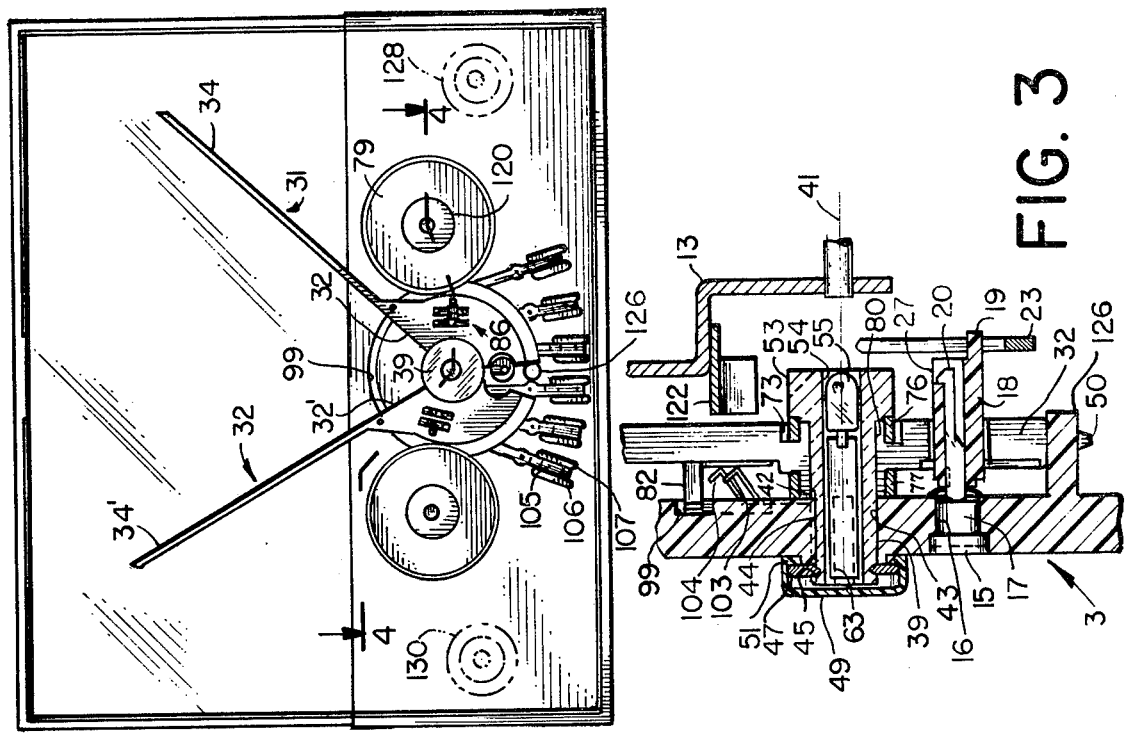
FIG. 3
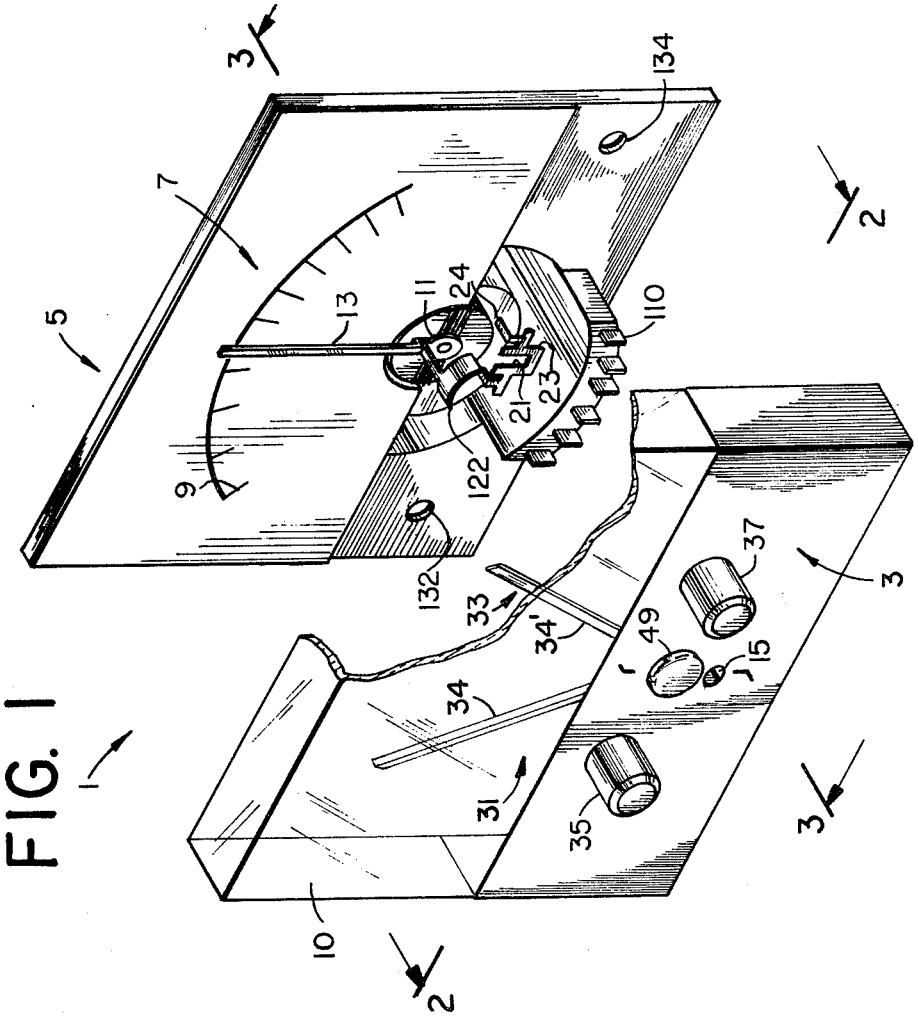
FIG. 1
FIG. 2

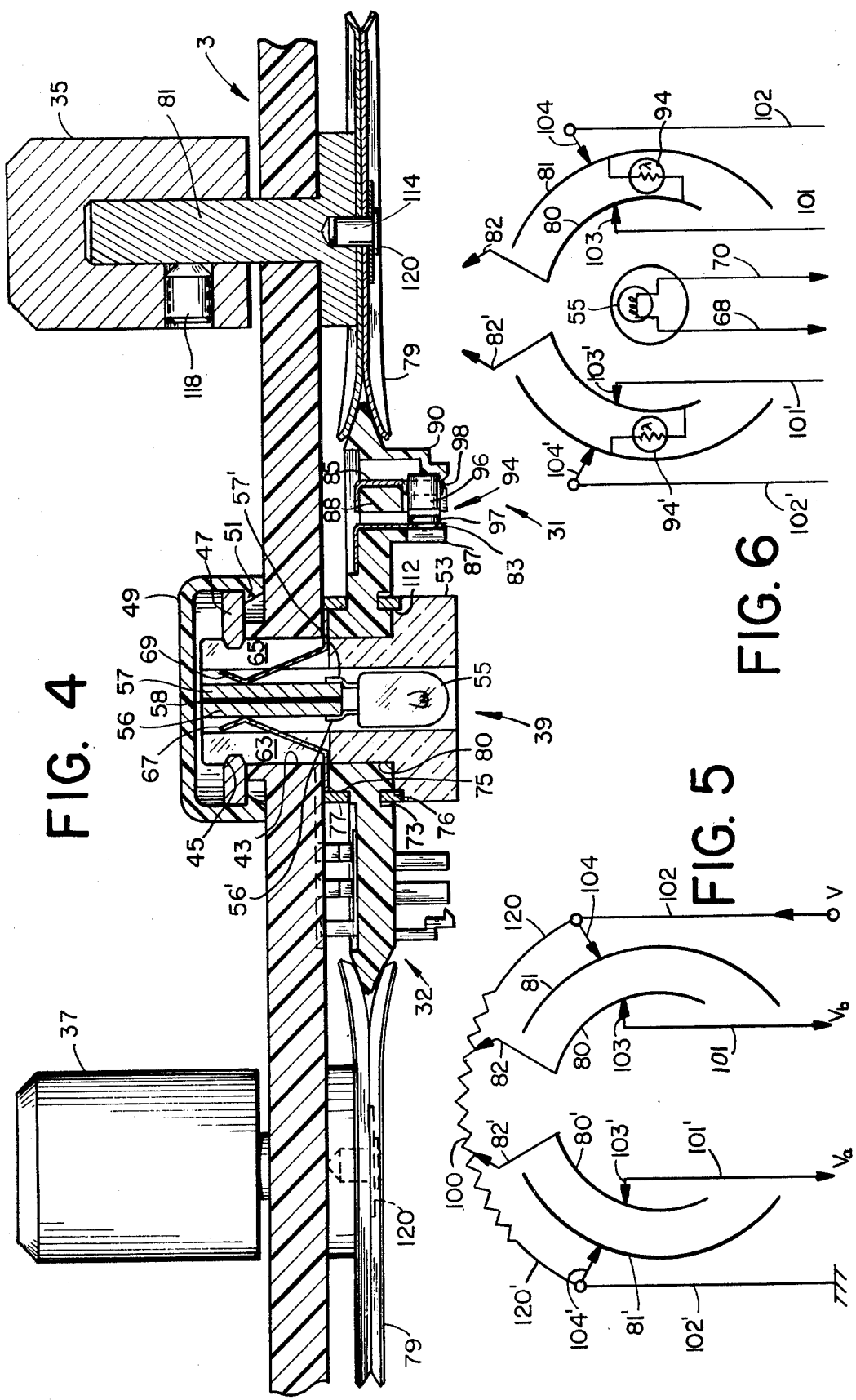

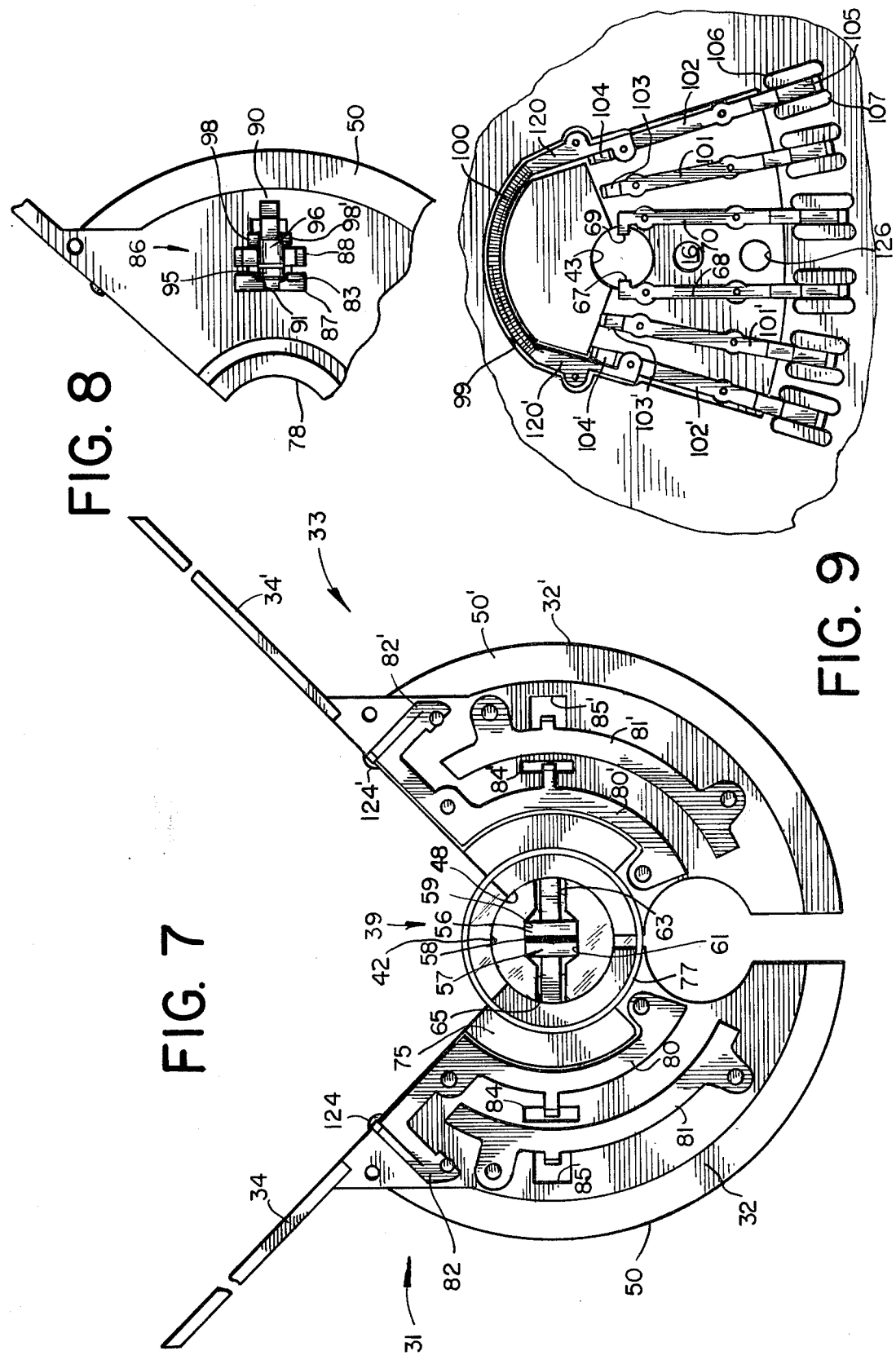

CONTROL METER USABLE AS A POTENTIOMETRIC OR PHOTOELECTRIC DEVICE

FIELD OF THE INVENTION

The present invention relates to electrical instruments, and more particularly to a control meter for providing an output signal when the parameter exceeds a preselected range.

Many methods and processes require the control of at least one parameter within a certain tolerance. Electrical instruments, typically known as control meters, are presently available to accomplish this task. A control meter can perform the standard measurement function of a meter in displaying the value of the monitored parameter. In addition, it provides a signal to suitable control devices when the parameter exceeds a preset range of values. The control device may be, for example, a relay for automatic process control or an alarm in the case of a manual system.

Various structural arrangements for control meters have been proposed all of which generally include a conventional electromagnetic meter movement responsive to the output of a suitable transducer which deflects a pointer along a calibrated scale to indicate the value of the measured parameter and indicator means movable to a preselected point on the scale, known as a set point, which represents one limit of a preselected range of parameter values which is not to be exceeded. The range may be from zero to the set point or from the set point and above when only one setpoint indicator is used. The inclusion of a second setpoint indicator permits selection of any range on the scale. When this range is exceeded by the parameter surpassing the upper limit or by dropping below the lower limit, a sensor generates an output signal indicative of this condition. Two types of sensors are widely available. One utilizes a potentiometric arrangement whereby movement of the setpoint indicator along the scale moves a potentiometric wiper to simultaneously generate a corresponding voltage set point signal. This set point signal and the measured value of the parameter are input into a comparator which provides a control signal when the measured value of the parameter exceeds the set point. Such comparator may either be a part of the control meter, or, more commonly, a part of the separate control apparatus.

The other type of sensing means includes a light source, a photoelectric sensor (called cell hereafter) positioned by the setpoint indicator, and a light interrupting means, usually in the form of an opaque vane, carried by the pointer to switch the electrical state of the cell when the vane is moved to or from a position between the cell and the light source due to an excursion of the measured parameter beyond the set point. In a typical arrangement, the cell receives light from a lamp when the parameter is within the preselected range. However, when the range is exceeded, the opaque vane is interposed by the pointer between the lamp and cell. The resultant abrupt change in the resistance of the cell is transmitted to an appropriate control device.

A control meter using either type of sensor provides generally acceptable performance but each is particularly well suited for different applications. For example, the potentiometric type is preferable when proportional control is required. A comparator responsive to the set point signal and the measured signal can be designed to control the process in proportion to the difference between such signals whereas the photoelectric type is substantially limited to a switching mode of operation. Other typical examples where this type of control meter is preferable include processes involving a dirty environment which may gradually impair the operation of a light dependent system by obscuring the lamp and/or cell. Temperature is also a consideration since resistors can be made less subject to temperature variations than cells. On the other hand, a photoelectric type may be preferable for some applications due to its superior isolation characteristics and its longer operational life since it is a non-contact, and therefore longer-wear, device.

Because, a definite market exists for both types of control meters, a manufacturer is obliged to offer both. However, as structural arrangements of control meters have evolved to date, the two types of meters have little in common. The basic components are found in both of course, as discussed above, but these and the other components are constructed and assembled in a considerably different manner. This is not surprising in view of the marked differences between the operation of a potentiometer and that of a photoelectric cell, and of the other components required to energize and to effectively utilize each one.

The significant lack of structural similarity between the two types of matters has an adverse cost effect. Two separate assembling facilities are required because, in effect, two different devices are manufactured each involving its own procedures, parts, personnel and labor skills. This has inescapable consequences on costs due to more space, labor and time being required to build both types of meters than if the manufacturer were to produce just one type.

SUMMARY OF THE INVENTION

It is, therefore, an object of the present invention to provide a control meter arrangement easily adaptable to function with a photoelectric or potentiometric sensing arrangement.

Another object of the present invention is to minimize the cost of producing these two types of control meters.

A more specific object of the invention is to maximize the commonality of parts between these two types of meters.

Still another object of the present invention is to provide an accurate control meter at reduced cost.

To accomplish these and other objects, a control meter assembly is provided which includes within the meter housing components for accommodating and cooperating with both a resistor and a cell. More specifically, in the preferred embodiment the setpoint indicators carry a cell holder connected between suitable contacts as well as a wiper engageable with a resistor which may be mounted on the face cover of the meter housing. Depending on which type of instrument is selected, either the resistor or the cell is installed. Should a photoelectric control meter be required, an opaque vane is connected to the meter movement for rotation therewith and a light source is mounted to shine light into the cell unless, of course, the vane intervenes.

Another aspect of the preferred embodiment is related to the arrangement for rotatably mounting and suitably positioning the setpoint indicators in relation to the light source and the vane. A simplified yet effective assembly is used in which the light source housing is centrally located on an axis about which the setpoint indicators and the meter movement rotate. The setpoint indicators are rotatable and secured to a bearing surface of the light source housing.

A further aspect of the preferred embodiment provides a setpoint indicator which serves to function in either type of instrument without any need for changing its structure. It carries a set of contacts on one surface and a wiper extending therefrom to engage the resistor. On its other surface it has a cell holder to which the same set of contacts is connected through openings communicating the two surfaces. Thus, as formed, it is cooperatively engaged with the resistor through the wiper should the potentiometric type be selected. On the other hand, only a cell need be installed in the holder to prepare it for usage in the photoelectric type.

BRIEF DESCRIPTION OF THE DRAWINGS

The features and advantages of this invention will become apparent from the following detailed description when read in conjunction with the accompanying drawings in which:

FIG. 1 is an exploded, partially fragmented perspective view of a control meter constructed in accordance with the principles of the present invention;

FIG. 2 is a rear elevational view of the face cover taken along lines 2—2 in FIG. 1;

FIG. 3 is a fragmentary cross sectional view of the lamp housing and various parts associated therewith taken along line 3—3 in FIG. 1 but with all the rear case except the pointer arm being eliminated;

FIG. 4 is a view partially in cross-section of the face cover and the various parts mounted thereon taken along line 4—4 of FIG. 2;

FIG. 5 is a circuit diagram of the potentiometric type of control meter;

FIG. 6 is a circuit diagram for the photoelectric type of control meter;

FIG. 7 is a front view of the lamp housing with both setpoint indicators mounted thereon and with the face cover removed;

FIG. 8 is an enlarged fragmentary view of one setpoint indicator as viewed in FIG. 2; and FIG. 9 is an enlarged fragmentary view of the face cover for the potentiometric type of control meter as viewed in FIG. 2 but without the lamp housing and the setpoint indicators.

DETAILED DESCRIPTION OF THE DRAWINGS

The control meter of the present invention includes several basic components common to available control meters. For the sake of clarity and conciseness, some of these components are not shown on the drawings or only shown in part. However, it is believed that a discussion of these standard components combined with the detailed description of those parts directly related to the present invention and its contributions to the control meter art will more than suffice to present a clear picture of a complete preferred embodiment.

FIG. 1 shows the structural relationship of the basic components common to presently available control meters. A housing 1 includes face cover 3 normally attached to rear case 5. A scale 7 carrying graduations 9 indicative of the value of a selected parameter is attached to the front of rear case 5. The scale is visible through transparent portion 10 forming a window in face cover 3. Mounted within rear case 5 is an electromagnetic meter movement 11, of the d'Arsonval type for example, which rotates pointer 13 to the appropriate position along the scale in response to measured values of the parameter. Rear case 5 and meter movement 11 are shown only sketchily since their construction is well known and does not directly form a part of the invention. U.S. Pat. No. 3,764,909 discloses one meter movement and housing which may be used in this instrument.

Pointer 13 is zero-centered with screwhead 15 on face cover 3 which is connected to shaft 17 in opening 16 of the face cover (see FIG. 3). A hollow cylinder 18 is securely attached to shaft 17 by cammed resilient latch 20 which engages an edge of the cylinder in groove 27. Rotation of screwhead 15 is transmitted by latch 20, which is retained in groove 27, to off-center pin 19. An elongated slot 21 in frame 23 receives pin 19. Frame 23 is attached by rod 24 to the meter movement. Rotation of screwhead 15 results in rotation of the meter movement as pin 19 slides in slot 21. To complete the description of the basic face cover assembly, setpoint indicators 31 and 33 are visible through window 10 and are coupled to knobs 35 and 37, respectively, which serve to rotate each to a desired position along scale 7.

Turning now to the features characteristic of the new and improved control meter of the present invention, it should be kept in mind that the primary task in its design is to provide an arrangement readily adaptable for use as either a potentiometric or a photoelectric type of control meter. To this end, the commonality of parts used in these meters has been maximized. Consequently, the bulk of the following discussion is devoted to structure not specifically attributable to either type. Those parts unique to a particular type will, of course, be fully dealt with in due course.

In the preferred embodiment of the present invention, most of the parts responsible for the advantages derived from the present invention are clustered about lamp housing 39 mounted on face cover 3. As shown in FIGS. 2 and 3, lamp housing 39 is a hollow cylinder mounted with its axis 41 perpendicular to face cover 3. One end of lamp housing 39 fits through a circular opening 43 in the face cover and has a key slot 42 into which fits projection 44 on the face cover. The portion of lamp housing 39 extending out of opening 43 has a circumferential groove 45 for retaining lock washer 47. Since the outer diameter of washer 47 is greater than that of opening 43 it keeps housing 39 from sliding backward out of the opening. Cap 49 snaps over washer 47 and is retained in place by an inner groove 51. Its utility is primarily of an aesthetic nature in covering the otherwise exposed end of lamp housing 39 although it also serves to seal the control meter from contaminants which may impair its operation.

Lamp 55 can be installed within the hollow center portion 54 of the lamp housing adjacent to a flange 53. The multipurpose usage of flange 53 as a support and rotational guide for the setpoint indicators 31 and 33 is discussed below. However, it should be noted at this point that at least the flange part of the lamp housing is transparent in order to disperse light from lamp 55 sideways, as viewed in FIG. 2. The lamp housing is also adapted to receive contacts for energizing lamp 55. As best seen in FIGS. 3, 4 and 7, contact bars 56 and 57, separated by insulator strip 58, are connected to lamp leads 56' and 57', respectively. These bars are secured within grooves 59 and 61 in any conventional manner, such as with glue. Elongated recesses 63 and 65 in the lamp housing provide access to bars 56 and 58 by contacts 67 and 69, respectively, attached to the face cover. Contacts 67 and 69 serve to supply power to lamp 55 as will be apparent when the entire assembly procedure and circuit connections are described below.

Setpoint indicators 31 and 33 are mirror images of each other. Consequently, only indicator 31 will be described in detail for the sake of conciseness and brevity. Parts of set point indicator 33 corresponding to those of indicator 31 have primed versions of the same reference numerals on the drawings.

Set point indicator 31 includes a body 32 and a pointer 34. Pointer 34 extends across scale 7 to indicate the selected set point. Body 32 has a forward surface shown in FIG. 7 and a rear surface shown in FIG. 2. The choice of "forward" and "rear" is related to the relationship of each surface to the face cover which is regarded as the forward part of the control meter. At any rate, both surfaces are relatively flat. However, the rear surface has a circular groove 73 (see FIG. 4) while the forward surface has a circular flange 75. These cooperate with retaining rings 76 and 77, respectively, to firmly yet rotatably secure the set point indicator to the lamp housing 39.

The forward surface of body 32 carries two arcuate contact strips 80 and 81. Contact strip 80 has at one end a resilient wiper 82 which, as best shown in FIG. 3, extends away from the setpoint indicator toward face cover 3 to slide on a suitably disposed resistor element as discussed below. Both contact strips also extend through openings 84 and 85 in body 32 to the rear surface which carries a photoelectric sensor, or cell, retainer 86. As best seen in FIGS. 2, 4 and 8, the retainer includes two parallel holders 87 and 88 and a resilient latch 90. Holder 87 includes slit 91 aligned with notch 92 in holder 88. Should use of the control meter with a photoelectric operation be desired, a cell 94 is inserted in notch 92. Its light sensitive forward end is pressed toward slit 91 by latch 90 which also secures it in place. In this position, the cell is oriented radially from lamp 55 so that it is aimed directly at lamp 55 at any setting of indicator 31. Cell 94 has a forward terminal 95 and a rear terminal 96 separated by an insulator ring 97. Extension 83 of contact 80 is a strip which flares out at its end to form a disc with a central opening. The disc engages terminal 95 while the opening permits the passage of light from lamp 55 through slit 91 to cell 94. Extension 85 of contact 81 is also a strip but it has two resilient prongs 98 and 98' for receiving terminal 96 of the cell therebetween. Thus, the contacts on the set point indicator can serve to carry current from a power supply (not shown) to contact strip 80, extension 83, terminal 95 and through cell 94 to terminal 96, extension 85, contact strap 81 and back to the power supply to close the circuit. These same contact strips 80 and 81 are used in the potentiometric version to make contact with the resistor element and the wiper of the potentiometer. Complete circuit details for this and the resistive operation of the control meter will be supplied below with reference to FIG. 6.

Body 32 of setpoint indicator 71 is arcuate in shape and its inner and outer edges form portions of two concentric circles. Inner edge 48 is of substantially the same diameter as bearing surface 80 on the lamp housing 39. This makes for a tight fit to prevent its wobbling during rotation. It should be noted that the precision with which the retaining rings fit on the setpoint indicator also contributes to smooth and accurate operation. Outer edge 50 of setpoint indicator 71 is beveled to fit easily between the discs of slip clutch 79. Shaft 81 transmits rotation of knob 35 to the slip clutch for corresponding rotation of the set point indicator. The slip clutch prevents damage from a forcible rotation of knob 35 when the set point indicator has already reached its limit of travel by enabling the set point indicator to remain stationary despite the turning of knob 35 and slip clutch 79. The outer edge of the slip clutch discs are flared away from each other to facilitate insertion of edge 50 of the setpoint indicator. The turning force exerted by the slip clutch can be set by selecting a particular diameter for disc 120 which is reveted to the slip clutch assembly.

Returning now to the face cover 3 to complete the description of the control meter structure, its rear surface as best shown in FIGS. 2 and 9, can be seen to have a groove 99 as well as a plurality of contacts. Groove 99 is a circular arc with its axis being coincident with axis 41 (see FIG. 3). It is adapted to receive a resistor element 100 (see FIG. 9) which in the illustrated embodiment of the invention is a wire wound resistor and cooperates with wiper 82 on the set point indicator to form a potentiometer. Since the axis of rotation of the set point indicator is also axis 41, wiper 82 slides along resistor 100 as pointer 34 is moved along the scale. Clearly, should no resistor be placed in groove 99, as would be the case for use of the control meter in its photoelectric mode, wiper 82 will simply ride freely in groove 99.

Of the set of contacts disposed below resistor 100, it will be recognized that the center ones 68 and 70 are extensions of previously discussed contacts 67 and 69, respectively. As seen in FIGS. 3 and 9, the upper ends of contacts 101 and 102 are formed into wipers 103 and 104, respectively, which engage contact strips 80 and 81, respectively, on set point indicator 31. Likewise, the upper ends of contact strips 101' and 102' are formed into wipers 103' and 104', respectively, engaging contact strips 80' and 81', respectively, on set point indicator 33. Because, contact strips 80, 80', 81 and 81' are circular and with the control meters fully assembled have an axis coincident with axis 41, the various wipers on the face cover continually engage the corresponding contacts on the set point indicator within the full rotational span of the latter.

Contact strips 68, 70, 101, 102, 101' and 102' each includes a bent resilient portion 105 on the lower end when viewed as shown in FIGS. 2 and 9. These firmly engage the protruding contacts 110 on rear case 5 shown on FIG. 1 when the control meter is assembled. Ridges 106 and 107 formed in the face cover on either side of portions 105 prevent its sideways deflection under the pressure exerted by contacts 110. Each of contacts 110 extends through to a terminal protruding from the back of rearcase 5 (not shown) for connection to appropriate instrumentation. Thus, for example, in the photoelectric version the terminals in circuit with contacts 67 and 68 would be connected to a power supply for energizing lamp 55. More details on this are furnished below when the circuit connections are discussed.

All the parts of the control meter apparatus discussed up to this point are common to both the potentiometric and photoelectric types of control meters except that the photoelectric sensor 94, lamp 55 and contact bars 56 and 57 are needed only in the photoelectric type, and resistance element 100 is used only in the potentiometric type. Thus, since the same basic parts are used, almost the entire meter can be built with only simple procedures being necessary to adapt it for operation as one type of meter or the other. The ease and simplicity of adaptation is enhanced by the absence of any need to change the configuration of any of the parts for either type of meter. Instead, the adaptation procedure involves only the addition of a few parts to enable usage of the apparatus in a particular mode. It may be advantageous at this point to follow the assembly steps. The following description will be devoted to this end but it will also include those few steps specific to the potentiometric type. Following that, the modifications required in the assembly procedure for the photoelectric type will be presented.

At the outset it is assumed that the face cover is prefabricated by any well known method as is the rear case assembly which includes the rear case itself and the meter movement.

Contacts 110 on the rear case and their cooperation with the other parts of the apparatus are a part of the contribution to the art made by the present invention but, again, their connection to rear case 5 is readily apparent and the details therefore need not be delved into any further.

The front cover is prepared with holes for shafts 81 (FIG. 4) of the slip clutches, the zero-centering assembly and for the lamp housing. Groove 99 is also formed. These may be machined or the front cover may be fabricated with these already formed. Contacts 68, 70, 101, 102, 101' and 102' are positioned and attached in any well known manner. For example, pins may be provided on the front cover which fit into openings in the contacts. The pins may then be flattened, as by utrasonic riveting, against the contacts to complete the attachment (all the contact strips in the control meter may be secured in this manner). Resistance strip 100 is secured in groove 99 by contacts 120 and 120'. Contacts 120 and 120' are brazed to the ends of resistor 100 and are attached to contacts 102 and 102' respectively.

With the front cover so arranged, the simplest and fastest way to assemble the remaining parts is with a jig suitably provided with pins. Although the jig is now shown, several parts of the control meter are specifically adapted to accommodate these pins. The assembly operation may start by placing lamp housing 39 on the jig with flange 53 down so that one pin fits into opening 54. Retaining ring 76 fits into a step 112 (see FIG. 4) on the outer edge of flange 53 so that it does not slide on surface 71. It, in turn, forms a flange-like member which fits into groove 73 on one setpoint indicator. After one setpoint indicator is pressed down into position the other setpoint indicator is similarly placed. Retaining ring 77 is then placed around flange 75 of both indicators. With both setpoint indicators now firmly positioned on the jig, first one and then the other slip clutch is initially engaged with a set point indicator and then placed on another pin which fits into recess 114 (see FIG. 4) designed for this purpose. The face cover is then placed backward on the jig, i.e., with its front facing upward. Shafts 81 fit through appropriate openings in face cover 3. As it is lowered until it can go no further, lamp housing 39 will protrude through opening 43 in the face cover. Lock washer 47 is inserted into groove 45 in the lamp housing and cap 49 is then snapped into place. Knob 35 may be fastened to shaft 81 by any convenient means such as set screws 118. This completes the assembly of the front cover.

In this arrangement, wiper 82 engages resistor 100 and wipers 103, 104, 103' and 104' on face cover 3 engage contact strips 80, 81, 80' and 81', respectively, on the set point indicators. The circuit diagram of FIG. 5 clearly depicts the electrical connections involved. Specifically, contacts 101, 102, 101' and 102' are stationary and remain, respectively, in continuous slidable connection with contact strips 80, 81, 80' and 81' through wipers 103, 104, 103' and $\psi'$, respectively. Connections 120 and 120' connect the ends of resistor 100 to contacts 102 and 102', respectively. Furthermore, wipers 82 and 82' engage resistor 100.

To utilize the control meter, a voltage V normally related to the full scale reading on the meter is placed across resistor 100 from a power source (not shown) connected between contacts 102 and 102'. Wipers 82 and 82' can be set to pick-off any voltage. Thus, if contact 102' is at ground, contact 82' will be at voltage $V_a$ and contact 101 will be at voltage $V_b$. As long as wiper 82 is closer to the high voltage end of resistor 100, $V_b$ will always be greater than $V_a$.

In operation, the limits of the control range are set by appropriately rotating wipers 82 and 82' along scale 7. The position of wiper 82' determines $V_a$ which sets the lower limit while the position of wiper 82 determines $V_b$ which determines the upper limit. These two voltages are compared to the values of the measured parameter and any appropriate control function of associated apparatus such as a control relay (not shown) is performed. For example, if the parameter falls below operation. When the parameter exceeds $V_a$, the control relay opens and the heating operation is terminated. At the other end of the scale, say too much heat is sensed; then the parameter would exceed $V_b$ and the control relay would close to actuate a cooling operation. As the temperature drops, the parameter falls below $V_b$ and the cooling operation is terminated as the control relay opens.

It should be apparent, that if the potentiometric mode is used, contacts 68 and 70 on face cover 3 and contact strip 81 on set point indicator 31 are not used. Nor are the photoelectric cell retainers 86 and the contact strip extensions 83, 85 necessary. However, these may be included even in the potentiometric type of control meter because their cost is so low as to be practically negligible at significant production quantities. The expense of labor time that would otherwise be required to manually adapt the face cover and set point indicators in this regard may not be justified.

Precisely the same assembly steps are involved in preparing the photoelectric type of control meter with only the following changes. Resistor 100 is not attached to face cover 3, nor of course are connectors 120 and 120'. Otherwise face cover 3 remains the same. Lamp 55 and associated conductive bars 56 and 57 are secured in lamp housing 39. (Of course, the cost of these may also be so marginal as to permit its economical usage in the potentiometric type so no change in this regard between the two types of meters is necessary). Cell 96 is inserted in retainer 86. Otherwise, the lamp housing and setpoint indicator assembly remains the same. The only other essential modification is the addition of an opaque vane 122 connected to pointer 13 (see FIGS. 1 and 3). Vane 122 is designed to pass between lamp 55 and cell 94 as pointer 13 rotates (See FIG. 3). It serves to block the passage of light to cell 94 when the pointer 13 reaches a limit value set by either one of the setpoint indicators.

FIG. 6 depicts a circuit diagram for the photoelectric type of control meter. Specifically, contacts 101, 102, 101' and 102' on face cover 3 are connected respectively by wipers 103, 104, 103' and 104' to contacts 80, 81, 80' and 81' on the setpoint indicators just as before. However, now lamp 55 is connected between contacts 68 and 70 and cells 94 and 94' are connected between contacts 101 and 102, and 101' and 102', respectively. In this arrangement, a power supply (not shown) is connected between contacts 68 and 70 to energize lamp 55. Suitable circuitry such as a control relay (not shown), is connected between contacts 101, and 102, and 101' and 102' to sense the condition of the cells to trigger any appropriate action independent on the position of vane 122.

In operation, the limits of the control range are set by suitably positioning setpoint indicators 31 and 33 so that vane 122 does not block light to either cell when the parameter is within this range. Should the parameter drop below the value set by indicator 31 or exceed the value set by indicator 33, the resistance of the cell involved changes as vane 122 is interposed between it and lamp 55. This changed condition is sensed by the control relay and suitable action will ensue.

It will be apparent that in this mode the control meter need not have wipers 82 and 82' nor groove 99. However, as mentioned before, the nominal cost of including these parts justifies their use so that an increase in the number of assembly steps is not required.

Lamp housing 39 performs a valuable role in simplifying the apparatus and enabling its ready adaptability to either type of control meter. It serves the conventional role, of course, of retaining the lamp and suitably dispersing its light. However, it doubles as a support and a bearing for the setpoint indicators. In the illustrated embodiment of the invention, flange 53 is a rear support for the indicators 31 and 33 which are accommodated between it and face cover 3. Without flange 53, those indicators would slide axially along the lamp housing. Moreover, circular surface of housing 39 between flange 53 and the elongated recesses 63 and 65 serve as a bearing for rotation of the indicators. This arrangement eliminates the part duplication required when two indicators are used by mounting both on a common element, namely housing 39. Furthermore, assembly of the apparatus is simpler and faster since fewer parts are involved.

The preferred embodiment further includes several features to enhance its operation and ease of assembly. A small protrusion 124 is provided on each indicator body 32 (see FIG. 7). When the two setpoint indicators are brought together, protrusions 124 and 124' keeps them slightly apart. The separation is such as to separate the cells by an angle slightly greater than the arc angle of vane 122. This separation prevents "contact chatter" arising from small oscillations of the meter movement when the selected control range is the minimum possible with this apparatus. A stop 126 is fixed on face cover 3 and serves to prevent movement of either setpoint indicator off the scale. Tapped bosses 128 and 130 (FIG. 2) are attached on the inside of face cover 3 and aligned with holes 132 and 134, respectively, in rear case 5. Screws (not shown) may be inserted through the holes and into the houses to complete the housing assembly.

It is evident from the foregoing description that the control meter apparatus constructed in accordance with the principles disclosed herein enables operation as either a potentiometric or photoelectric instrument but with the advantages of assembling, in effect, only one type of apparatus. The advantages associated with this feature are due to maximization of parts common to both meters, the multi-function utility of some parts, the overall elegance and simplicity of the design and the minimization of parts and manual effort necessary to adapt the apparatus for operation as one type of instrument or the other.

Having described a preferred embodiment and various alternatives thereof, other modifications and changes will likely occur to those skilled in the art. For example, a non-indicating control meter can be used having no scale and pointers with the control range being preset at the factory. In addition, some applications may require only one setpoint indicator. Also the mounting of some parts on one of the face cover and rear case may be switched to the other one. Furthermore, the setpoint indicators may be constructed so as not to interfere with the movement of one another over the entire range of the scale. This would enable a reversal of roles so that, say, the indicator for the lower limit could be selectively used to set the upper limit. Moreover, various electrical components other than a resistor can be used to provide a variable electrical value. It is intended that these and other such changes be included within the spirit and scope of the invention as defined in the appended claims.

I claim:

1. A meter apparatus comprising:
a meter housing;
measurement means rotatably mounted in said housing about an axis for movement in response to measurements of a selected parameter;
means rotatable about said axis for setting the limits of a predetermined range of values of said parameter;
means for securing to said housing a component having a measurable electrical characteristic;
means for attaching a photoelectric sensor to said range setting means;
means for fixedly securing illuminating means in said housing to direct light at said photoelectric sensor means;
means for securing light interrupting means to said measurement means for movement therewith between a light interrupting and a light transmitting position; and
said range setting means including first contact means connectable to said photoelectric sensor means and disposed for detecting a portion of the electrical characteristic value of said component corresponding to the position of said range setting means about said axis.

2. The meter apparatus of claim 1, further comprising a photoelectric sensor on said range setting means, an illuminating means in said housing and a light interrupting means fixed to said measurement means.

3. The meter apparatus of claim 2, wherein said first contact means comprises two conductive strips having said photoelectric sensor electrically connected therebetween and further comprises a wiper contact adapted to be operatively connected to said component.

4. The meter apparatus of claim 3, wherein said range setting means is rotatable on a bearing surface of the illuminating means.

5. The meter apparatus of claim 4, further comprising means for rotatably securing the range setting means to the illuminating means.

6. The meter apparatus of claim 5, wherein said housing comprises a rear case and a face cover attached to said case, the measurement means being rotatably mounted in said case and the illuminating means being fixed to said cover.

7. The meter apparatus of claim 2, wherein said housing comprises a rear case and a face cover, said measurement means being rotatably mounted in said case, and the range setting means and illuminating means being mounted on said cover.

8. The meter apparatus of claim 7, wherein said illuminating means comprises a bearing surface for rotation of said range setting means.

9. The meter apparatus of claim 1, further comprising said component fixed in said housing and operatively connected to said first contact means.

10. The meter apparatus of claim 9, wherein said component comprises a resistor, said first contact means including a wiper cooperatively contacting said resistor to form a potentiometer assembly.

11. The meter apparatus of claim 10, wherein said first contact means further comprises two conductive strips adapted to have the photoelectric sensor electrically connected therebetween, said wiper being attached to one of said conductive strips.

12. The meter apparatus of claim 11, wherein said illuminating means comprises a lamp housing fixed to said meter housing and having a bearing surface, said range setting means being rotatably engaged with said bearing surface.

13. The meter apparatus of claim 12, wherein said meter housing comprises a rear case and a face cover, said measurement means being mounted in said case, and said resistor and said range setting means being mounted on said face cover.

14. The meter apparatus of claim 9, wherein said meter housing comprises a rear case and a face cover, said measurement means being mounted in said case, and said component and said range setting means being mounted on said cover.

15. The meter apparatus of claim 9, wherein said illuminating means comprises a bearing surface, said range setting means being rotatably engaged with said bearing surface.

16. The meter apparatus of claim 1, further comprising second contact means fixed in said housing and having a portion engaging the first contact means.

17. The meter apparatus of claim 16, wherein the housing comprises a rear case and a face cover, the measurement means being mounted in said case, and the range setting means, the first contact means, the component and the second contact means being mounted on said cover.

18. The meter apparatus of claim 17, further comprising third contact means mounted in said case in engagement with another portion of said second contact means.

19. The meter apparatus of claim 1, wherein the measurement means include an electromagnetic meter movement responsive to measurement of said parameter and attached to a pointer extending across a scale with a series of graduations disposed thereon.

20. The meter apparatus of claim 1, wherein the rotatable range setting means comprises: a body having an indicator arm extending therefrom, manually rotatable knobs on the outside of said housing and connected to a shaft extending into said housing, and a slip clutch connected to said shaft and drivably engaging said indicator body.

21. The meter apparatus of claim 1, wherein said range setting means comprises: two set point indicators abuttable against each other, and an aligned protrusion means on abuttable portions of said indicators to prevent the setting of both indicators on the same parameter value.

22. Apparatus for rotatably mounting a set point indicator in a control meter including a meter movement, a photoelectric sensor carried by said set point indicator, and a light source, said meter movement having attached thereto an opaque vane rotatable about a given axis for selectably interrupting the path of light from said light source to said sensor, comprising:
a light source housing means having a cylindrical bearing surface with an axis coincident with said given axis; and
means for rotatably securing said set point indicator to said bearing surface for rotation relative to said bearing surface.

23. The apparatus of claim 22, wherein said light source housing is cylindrical with an axis coincident with said given axis, said bearing surface comprising a portion of the outer circumference of said light source housing.

24. The apparatus of claim 23, wherein said light source housing comprises a substantially flat portion extending radially from the light source housing proper, and wherein said securing means comprises a flange on one of said flat portion and the set point indicator and a groove for accommodating said flange in the other.

25. The apparatus of claim 24, wherein at least one of said flange and said groove is at least partially circular with an axis coincident with said given axis.

26. The apparatus of claim 25, wherein said flange is on the set point indicator and the groove is on said flat portion.

27. The apparatus of claim 26, wherein said groove is formed between a ring resting on said flat portion and the cylindrical light source housing.

28. The apparatus of claim 27, wherein the flange is on one side of said set point indicator adjacent said bearing surface, said securing means further comprises another flange on the other side of said set point indicator adjacent said bearing surface and a ring having said flange rotatably engaged between it and the bearing surface.

29. The apparatus of claim 22, wherein said securing means comprises a body connected to and extending away from said light source housing, said body having a surface perpendicular to said given axis, a first protrusion on said set point indicator extending generally along said given axis and a ring supported on said body surface and having said protrusion rotatably engaged between it and said bearing surface.

30. The apparatus of claim 29, wherein said securing means further comprises a second protrusion extending axially away from said first protrusion and another ring having said second protrusion rotatably engaged between it and said bearing surface.

31. A rotatable set point indicator for use in a control meter apparatus usable in either a photoelectric or potentiometric mode comprising:
a body adapted for rotation about a given axis;
an indicator arm extending away from said body;

two arcuate conductive strips concentrically mounted on said body about said given axis and adapted to contact a photoelectric sensor therebetween, said strips being adapted for engagement with contact means on said meter apparatus to provide a signal representative of the condition of said sensor; and a resilient wiper contact mounted on said body and connected to one of said strips and adapted to slide along a resistor mounted in said control meter apparatus to provide a variable resistance having a value dependent on the position of said set point indicator.

32. A rotatable set point indicator for use in a control meter apparatus of the photoelectric type comprising:
a body adapted for rotation about a given axis and defining an opening for communicating opposite surfaces thereof;
means on one surface of said body for securely retaining a photoelectric sensor;
contact means on the other surface of said body and extending through said opening to engage the sensor, said contact means being adapted for slidable engagement with wiper contacts on said meter apparatus to provide a signal indicative of the condition of said sensor.

33. A meter apparatus comprising:
a housing;
a scale mounted within and visible through a transparent portion of said housing and having a series of graduations disposed thereon indicative of the values of a selected parameter;
a pointer rotatably mounted in said housing for rotation about a given axis and extending across said scale; said pointer being adapted for attachment to light interrupting means for moving said means between a light interrupting and a light transmitting position;
means for rotating said pointer for movement along said scale in response to measurements of said parameter;
means for positioning said indicator means along said scale to set limits on a selected range of parameter values;
means for attaching to said housing a component having a measurable electrical characteristic;
means for attaching photoelectric sensor means to said set point indicator means;
means for mounting illuminating means in said housing to direct light at said sensor means; said light interrupting means being movable from one of its positions to the other when said pointer is outside said selected range; and
contact means on the set point indicator mean for connection to the sensor means and for detecting at least a portion of the electrical characteristic of said component.

34. The meter apparatus of claim 23, wherein said housing comprises a rear case and a face cover, said scale, pointer and means for rotating said pointer being mounted in said case, and said component attaching means, set point indicator means, and illuminating means being mounted on said face cover.

35. The meter apparatus of claim 33, wherein said set point indicator means comprises two independently rotatable units.

36. A photoelectric control meter apparatus comprising:
a meter housing;
a scale mounted within said meter housing having a series of graduations indicative of the value of a selected parameter disposed thereon and visible through a portion of said housing;
measurement means mounted within said meter housing and rotatable about a given axis in response to measurements of said parameter to register a value on said scale;
illuminating means mounted in said meter housing;
set point indicator means rotatably secured to said illuminating means for rotation about said given axis;
means for rotating said set point indicator means about said given axis to a preselected set point on said scale indicative of a predetermined value of said parameter;
photoelectric sensor means mounted on said set point indicator means in the path of light from said illuminating means; and
light interrupting means attached to said set point indicator means for movement between a light interrupting position and a light transmitting position to accordingly change the amount of light sensed by the photoelectric sensor when said predetermined value of the selected parameter is measured.

37. The apparatus of claim 36, wherein said illuminating means comprises a circular bearing surface having an axis coincident with said given axis, said indicator means being rotatably engaged with said bearing surface.

38. The apparatus of claim 37, wherein said illuminating means further comprises a flat support surface extending perpendicularly to the given axis and away from said bearing surface, said indicator means being in rotatable engagement with said bearing surface.

39. The apparatus of claim 36, further comprising means for securing said indicator means to said illuminating means.

* * * * *